Sept. 13, 1955 G. S. FAY 2,717,983

TUNING STRUCTURE

Filed Feb. 8, 1952 2 Sheets-Sheet 1

INVENTOR.
GERALD S. FAY

BY James and Franklin
ATTORNEYS

Sept. 13, 1955 G. S. FAY 2,717,983

TUNING STRUCTURE

Filed Feb. 8, 1952 2 Sheets-Sheet 2

INVENTOR.
GERALD S. FAY

BY James and Franklin
ATTORNEYS

United States Patent Office 2,717,983

Patented Sept. 13, 1955

2,717,983

TUNING STRUCTURE

Gerald S. Fay, Chicopee Falls, Mass., assignor to General Instrument Corporation, Elizabeth, N. J., a corporation of New Jersey Application February 8, 1952, Serial No. 270,574

27 Claims. (Cl. 336—131)

The present invention relates to a tuning structure adapted for control of a plurality of circuits to be gang-tuned, to such a structure adapted for use in limited spaces, and to such a structure in which the coils to be tuned are mounted in a novel manner and may have their positions adjusted with respect to one another.

The space which a given tuning unit occupies is often a matter of considerable importance. This is particularly true in tuning units designed to be employed with communicating equipment mounted in vehicles such as automobiles. Today the tendency in automobile design is toward minimizing the dashboard area, some automobile designers having gone so far as to practically eliminate the dashboard, thus reducing the hazard to occupants of the front seat in case of an accident. Built-in automobile radios have almost exclusively been located behind the dashboard, and elimination or minimization of the dashboard area poses a real problem with respect to the design and location of automotive radio equipment.

It would be possible to mount the tuning unit and the rest of the radio set at a point remote from the operator of the car, some mechanical or electrical transmission system being provided between the operator and the remote point where the tuning unit is located so that the set can be controlled by the operator in a convenient manner. The disadvantages of this expedient are obvious and well recognized and the tendency has constantly been away remote control and toward direct operation.

The present invention relates to the production of a tuning unit which can be direct-controlled and which is so designed that it takes up but a truly minimal amount of space, thus permitting it to be mounted conveniently with respect to the operator of a car even when no dashboard space whatsoever is available. To this end the tuning unit is long and narrow, its cross sectional area being only slightly greater than that of any one of the tuning elements, such as coils, which are employed therein. By reason of this narrow elongated design, the tuning unit can be mounted end-first on a dashboard of very small size, or can even be fastened directly to the steering column of the automobile, extending therealong, without inconveniencing the driver in any way. The remainder of the communication equipment can be located remote from the tuning unit, connected thereto by means of appropriate conductive leads. This is not a disadvantage, because once tuning control has been effected in a positive and direct manner, accurate functioning of the communication equipment will ensue even if it is remotely positioned.

To this end, the tuned coils of the various circuits involved in the communicating equipment are mounted in axially aligned relationship, and tuning elements, here shown as conventional ferromagnetic coils, are caused to simultaneously move in relation to their respective coils so that those coils will be simultaneously tuned. In order to minimize cross-sectional area, the tuning elements are also coaxially mounted and move in the direction of that axis, so that no additional area need be provided to accommodate for their movement.

In order to provide for ready assembly of the tuning unit, the base takes the form of a long channelled member provided with slots at the points therealong where coils are to be mounted, the coils in turn being retained in position on the base by means of resilient clips which are operatively connected to the coils and which forcibly engage the slots in the base. Removal or replacement of coils, should that be necessary, is thus facilitated.

Proper tracking between the circuits to which the individual coils are electrically connected is provided by adjustment of the tuning characteristics of one coil with respect to another. In the tuning unit of the present invention, in which the tuning cores are positioned in line with one another and are movable for tuning purposes in their common axial direction, tracking adjustment by varying the relative positions of the cores, as is common in the other types of permeability tuning apparatus, is not feasible because of the difficulty of access to the cores.

Accordingly, in the instant invention it is the coils themselves the relative position of which may be varied. This is accomplished by making the slots through which the clips pass elongated in the direction of motion of the tuning cores, and by providing adjustable connections between the coils and the base the effective length of which may be altered in the direction of motion of the tuning cores. This adjustable connection is preferably provided on the underside of the base so that access to it is facilitated and so that it will not interfere with the proper functioning of the tuning unit once that adjustment has been made.

The tuning unit of the present invention may be made from a plurality of standardized parts, readily fabricatable on a mass production basis, which may be quickly and easily assembled by relatively unskilled persons. The construction in question also lends itself to the use of coils which are electrically and magnetically shielded from one another, thus improving fidelity of operation of the communicating equipment with which they are used.

While the tuning elements are here shown in the form of ferromagnetic cores, it will be apparent that they may assume a variety of conventional forms, such as, for example, conductive cores or magnetic or conductive shells or vanes.

To the accomplishment of the above, and to such other objects as may hereinafter appear, the present invention relates to the structure of a tuning unit as defined in the appended claims and as described in this specification, taken together with the accompanying drawings in which:

Figures 1, 2, 3:
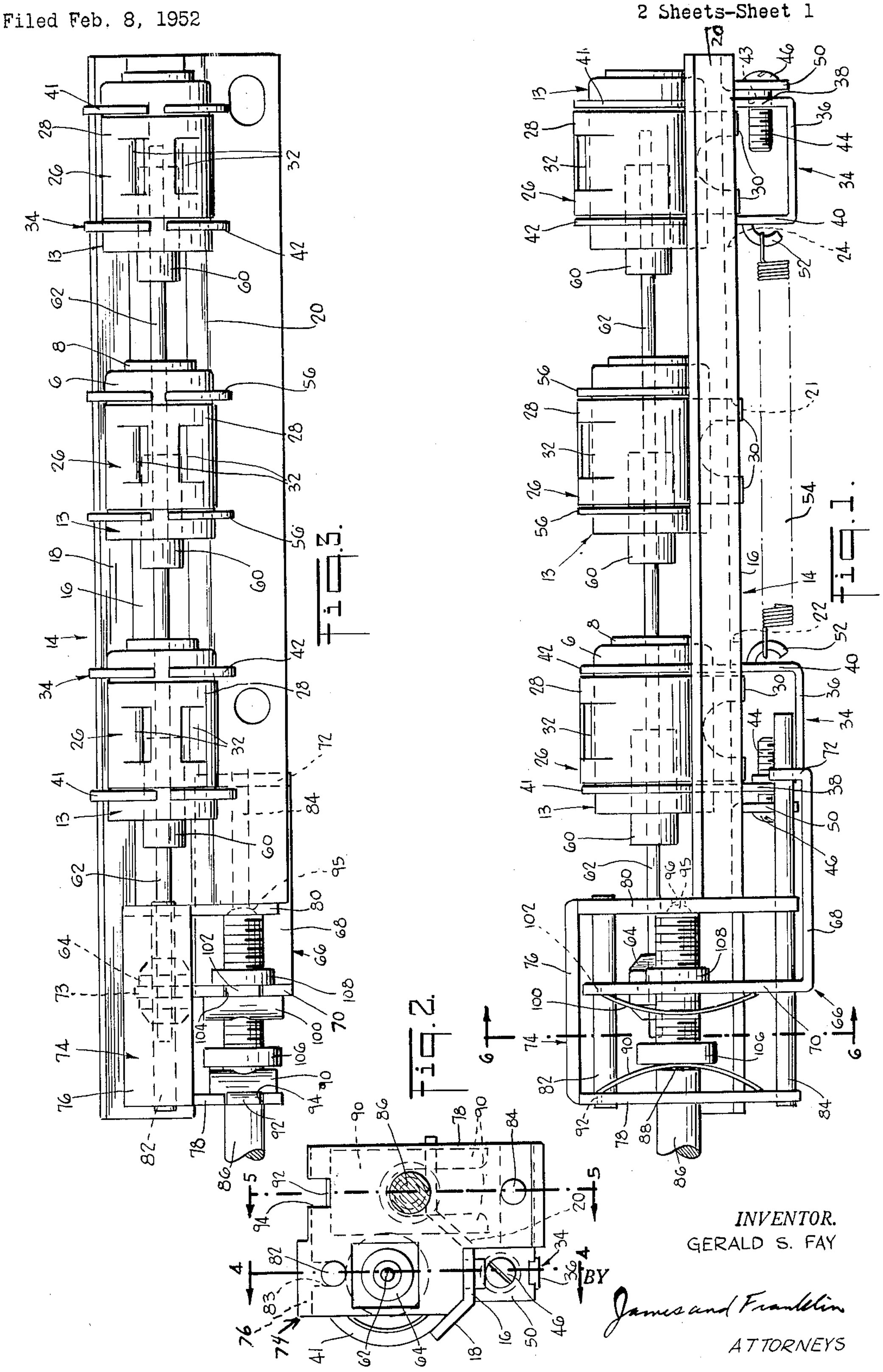
Fig. 1 is a front elevational view of a tuning unit of the present invention.
Fig. 2 is a side elevational view thereof taken from the lefthand side of Fig. 1.
Fig. 3 is a top plan view thereof.

Each of the coils 2 is mounted on the outside of a cylindrical insulating coil form 4 which is retained within a conductive shield 6 by means of a bushing 8. In order to magnetically shield each coil 2 from external magnetic influences, and in order to advantageously effect its tuning characteristics, a shell 10 of magnetic material may be held in position within the shield 6 and around the coil 2 by means of the same bushing 8. A retaining washer 12 may be provided within the shield 6 and against the end of the shell 10 not held in position by the bushing 8.

The thus defined coil assemblies generally designated 13 are mounted on an elongated base generally designated 14, that base having a channel-shaped cross section as defined by the bottom wall 16 and the flaring side walls 18 and 20. As here disclosed the base 14 is adapted to support three coil assemblies 13, and consequently the bottom wall 16 is provided with an inner slot 21 and outer slots 22 and 24, those slots extending in the direction of length of the base 14 and the slots 22 and 24 being longer than the slot 21 in order to permit adjustment of the position of the coils mounted thereat, as will become apparent.

Figures 4, 5, 6, 7, 8, 9:
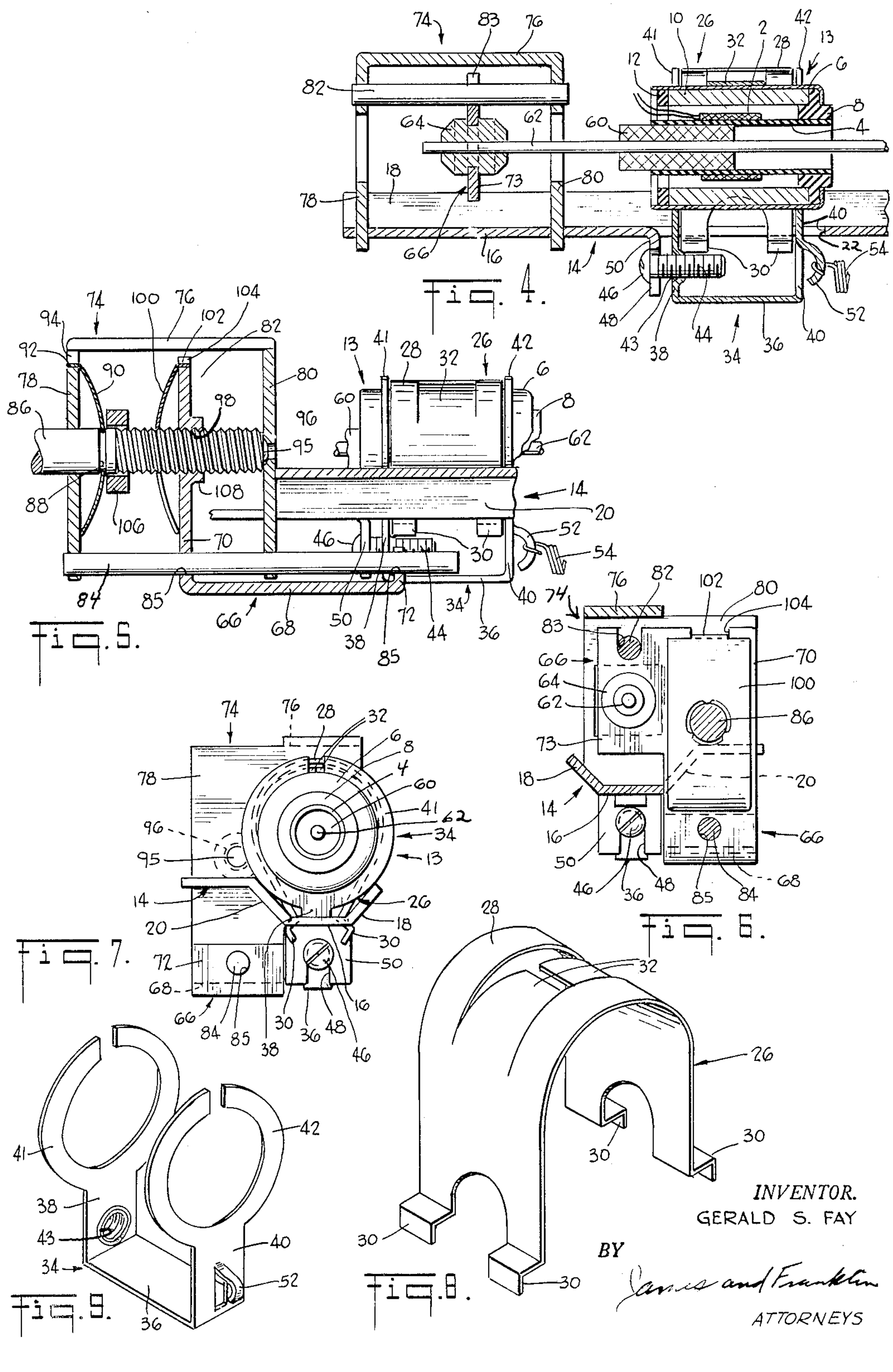
Fig. 4 is a cross sectional view thereof taken along the line 4—4 of Fig. 2.
Fig. 5 is a cross sectional view thereof taken along the line 5—5 of Fig. 2.
Fig. 6 is an end cross sectional view taken along the line 6—6 of Fig. 1.
Fig. 7 is an end elevational view taken from the righthand end of Fig. 1.
Fig. 8 is a perspective view of the clip employed for holding the coil in position.
Fig. 9 is a perspective view of the holder by means of which axial adjustment of the coils is achieved.

Each of the coil assemblies 13 is secured to the base 14 between the flaring side walls 18 and 20 thereof by means of a resilient substantially U-shaped clip generally designated 26 and best shown in Fig. 8. This clip, which may be formed of spring steel and which may be stamped or otherwise cut from sheets of that material, is bent so as to define a U-shaped body 28 having feet 30 at the ends thereof. The arched portion of the body 28 may be provided with inbent fingers 32 so that the coil assembly 13 may be more readily engaged.

When a coil assembly is to be mounted on the base 14 a clip 26 is placed around the conductive shield 6 so that the fingers 32 of the clip 26 engage the periphery of the shell 6. The feet 30 of the clip 26 are then pressed toward one another and around the shell 6 until those feet can be inserted through one of the slots 21, 22 or 24. After the feet 30 pass through that slot they are released, the resiliency of the spring 26 causing the feet 30 to spring outwardly and into engagement with the side edges of the slot, thus firmly holding the coil assembly in position. The length of the slot 21 is substantially equal to the width of the clip 26, so that when the feet 30 of a clip 26 have been passed through the slot 21 and released, that clip 26, and its associated coil assembly 13, cannot be moved in the direction of the length of the base 14. However, since the slots 22 and 24 are longer than the slot 21, when a clip 26 is engaged with one of the slots 22 or 24 it will hold its associated coil assembly 13 onto the base 14, and will prevent movement of that coil assembly 13 widthwise of the base 14, but lengthwise movement of its associated coil assembly 13 will be permitted within limits defined by the length of the slots 22 or 24.

Since the clip 26 partially surrounds the curved periphery of the shield 6, and since the slots 21, 22 and 24 are in line with one another and oriented in the direction of the length of the base 14, each of the coil assemblies will be mounted on the base 14 so that the coils 2 are coaxial, their common axis extending along the length of the base 14, each of the coils 2 being axially spaced from the other.

It has already been mentioned that, by reason of the elongated nature of the slots 22 and 24 when compared to the slot 21, the positioning of the coil assemblies whose clips 26 are received in the slots 22 and 24 may be axially adjusted so as to bring those coil assemblies closer to or farther from one another and the axially fixed coil assembly 13 whose clip 26 is received within slot 21. To this end the mounting elements for those outer coil assemblies include, in addition to the clip 26, a holder generally designated 34 and best shown in Fig. 9, said holder being defined by a base 36 of a width and length such as to pass freely through the slots 22 and 24 and a pair of upstanding arms 38 and 40 also passable through the slots 22 and 24 and carrying ring portions 41 and 42 capable of encompassing the shield 6 of a coil assembly B on either side of the clip 26. The arm 38, which adapted to be outwardly disposed toward the ends of the base 14, is provided with an internally threaded aperture 43 within which a screw 44 is threadedly received, the head 46 of that screw extending forwardly from the arm 38 for an adjustable distance depending upon the degree to which the screw 44 is threaded into the aperture 43 in the arm 38. The outwardly projecting portion of the screw 44 is adapted to be received within a slot 48 formed in a lug 50 integral with and depending downwardly from the base 14. The wall 40 is provided with an integral outwardly struck hook 52 adapted to engage one end of a spring 54. The spring is tensioned so as to tend to pull the holder 34, and its associated coil assembly 13 and clip 26, toward the inner end of the slot 22 or 24 through which the holder 34 passes, interengagement between the screw head 46 and the outer surface of the lug 50 positively limiting the inward motion of the holder 34. While the spring 54 could be anchored to the base 14, when more than one individually movable coil assembly is involved it is most convenient to mount the spring 54 in extended tensioned condition between the holders 34 on either side of the central or inner coil assembly 13, the spring 54 tending to pull the left hand holder 34 and its associated coil assembly 13 inwardly and to the right as viewed in Fig. 1 and tending to pull the right hand holder 34 and its associated coil assembly 13 inwardly and to the left as viewed in Fig. 1, the motion of each of these holders 34 being limited by the extent to which their respective screws 44 are threaded through the apertures 43. It will be noted that the identical holder 34 is utilized for each of these outer coil assemblies 13, but that the holders are oppositely oriented. It also will be noted that access to the screw heads 46 is free and unobstructed from each end of the base 14 (see Figs. 2 and 7), so that the position of each of the outer coil assemblies 13 may be individually adjusted in an extremely simple manner.

The inner coil assembly is not provided with a holder 34 because the size of the slot 20 in which its clip 26 is received does not permit it any axial motion. Because the outer diameter of the ring portions 41 and 42 of the holder 34 is greater than the outer diameter of the coil assemblies 13, it is the former and not the latter which engage the walls 16, 18 and 20 of the base 14 (see Fig. 7) and position their associated coil assemblies 13 vertically and laterally. In order to ensure that the central or inner coil assembly 13 will be properly aligned with the outer coil assemblies 13, spacer rings 56 having the same outer diameter as the ring-like portions 41 and 42 are provided around the shield 6 of that coil assembly 13 at each end thereof.

The individual tuning cores 60 are mounted on a single tuning rod 62, those cores being received without excessive clearance within the coil forms 4, those coil forms thus supporting the cores 60 and the tuning rod 62 along its length. While means may be provided for adjusting the relative position of the cores 60 on the rod 62, this is not at all essential, in view of the fact that the coil assemblies 13 themselves may be shifted relative to one another.

The left hand end of the rod 62 is grasped by grommet 64 mounted within a central aperture in the carriage generally designated 66, that carriage comprising a horizontal base 68, a vertical plate 70 at one end thereof, and a guiding flange 72 at another end thereof. The grommet 64 is mounted in a laterally extending portion 73 of the vertical plate 70 which extends opposite the axis of the coil assemblies, the remainder of the carriage 66 being disposed to one side thereof, as may best be seen in Figs. 3 and 6. A frame generally designated 74 is fixedly secured to the base 14, that frame comprising a top wall 76, an outer wall 78 and an inner wall 80.

The top wall 76 is aligned with the axis of the coil assemblies 13, and a guide rod 82 is mounted thereunder and passes through a slot 83 in the laterally extending wall portion 73 of the carriage 66, the wall portion 73 being slidable over the rod 82 for guiding purposes. The outer and inner walls 78 and 80 of the frame 74 extend to one side of the base 14, another guide rod 84 being carried between the laterally extending portions of those walls, that rod being slidably received in apertures 85 in the vertical wall 70 and guiding flange 72 of the carriage 66, in order to steady that carriage and guide it in rectilinear movement.

A control shaft 86 is rotatably received through an aperture in the laterally extending portion of the frame outer wall 78 above the guide rod 84, that shaft having a groove 88 within which the teeth of a centrally apertured tension drive nut 90 are received, a lug 92 on that nut being received in recess 94 in the outer wall 78 so as to prevent the nut from rotating, the nut being tensioned so as to urge the control shaft 86 to the right so that its tip 95 engages in aperture 96 in the front frame wall 80. The forward portion of the shaft 86 is threaded, and passes through and engages an internally threaded aperture 98 in the vertical wall 70 of the carriage 66. A second resilient tension drive nut 100, a lug 102 of which is received within notch 104 at the upper edge of the wall 70 so as to prevent rotation of the drive nut 100, engages the threaded portion of the shaft 86 so as to urge the shaft 86 to the left as viewed in Fig. 1, thus taking up backlash. A spacer ring 106 is loosely mounted on the shaft 86 between the drive nuts 90 and 100 so as to act as a positive stop for motion of the carriage 66 to the left. Engagement of the hub 108 on the wall 70 around the aperture 98 with the frame wall 80 acts as a positive stop in the opposite direction. As the control shaft 86 is rotated in one direction the carriage 66 will be caused to move to the right, guided in that motion by the rods 82 and 84. When the carriage 66 thus moves the tuning control rod 62 and its associated cores 60 will be similarly and simultaneously moved, thus causing those cores to telescope within their respective coils 2 so as to vary the inductance of those coils in one sense. When the tuning shaft 86 is rotated in the opposite direction the carriage 66 will move to the left and the cores 60 will then be withdrawn from their respective coils 2, thus varying the inductance of those coils in the opposite sense.

Once the unit has been assembled, proper tracking between the various circuits to which the respective coils may be connected can be achieved by individually adjusting the position of the outer coil assemblies 13 with respect to the central or inner coil assembly 13 by turning the screws 44 the heads 46 of which are accessible from the ends of the unit. This may be done without in any way affecting the other components of the unit, and without having to manipulate the coils themselves or their tuning cores. As is particularly clear from an inspection of Figs. 2 and 7, the driving mechanism which moves the cores 60 is so positioned as to permit ready access to the adjusting screws 44, being disposed either to one side of or above those screws, the screws depending from the base 14 so that the coils and cores do not interfere with ready accessibility.

All of the mounting parts may be made by stamping or other operations which lead to mass production at minimum expense. The parts are standardized, the same clips being employed for all coil assemblies and the same holders being employed for all movable coil assemblies. The parts fit together readily, so that the unit may be assembled by unskilled personnel. Moreover, any individual coil assembly may readily be removed from the unit and a new coil assembly inserted in its place without requiring dislocation of any of the other units.

While but a single embodiment of the present invention has been here disclosed, it will be apparent that many variations may be made therein, within the spirit of the invention as defined in the following claims.

I claim:

1. A tuning unit comprising an elongated base, a plurality of coils having central tuning apertures mounted on said base so that said apertures are coaxial and said coils are axially spaced from one another, and a mounting connection between a coil and said base including resilient means active between said coil and said base urging said coil in one axial direction and a rigid means of adjustable effective length operatively connected between said base and said coil for retaining said coil in a predetermined but variable position against the action of said resilient means, whereby the spacing of said coil relative to the other coils is independently variable.

2. A tuning unit comprising an elongated base, more than two coils having central tuning apertures mounted on said base so that said apertures are coaxial and said coils are axially spaced from one another, individual tuning means for said coils mounted on said base so as to be movable through said tuning apertures, an inner one of said coils being mounted on said base so as to be axially immovable, a pair of coils outwardly axially disposed to either end of said inner coil being mounted on said base so as to be axially movable, resilient means active on said outer coils so as to urge them in an axial direction, and a rigid means of adjustable effective length operatively connected between said base and said outer coils for retaining said coils in a predetermined but variable position against the action of said resilient means, whereby the relative spacing of said coils is independently variable.

3. The tuning unit of claim 2, in which individual rigid means of adjustable effective length are provided for each of said outer coils, whereby the relative spacing of each of said outer coils may be individually varied.

4. A tuning unit comprising an elongated base, more than two coils having central tuning apertures mounted on said base so that said apertures are coaxial and said coils are axially spaced from one another, an inner one of said coils being mounted on said base so as to be axially immovable, a pair of coils outwardly axially disposed to either end of said inner coil being mounted on said base so as to be axially movable, resilient means active between said outer coils so as to urge them toward one another and hence toward said inner coil, and rigid means of adjustable effective length operatively connected between said base and said outer coils for retaining said coils in a predetermined but variable position against the action of said resilient means, whereby the relative spacing of said coils is independently variable.

5. The tuning unit of claim 4, in which individual rigid means of adjustable effective length are provided for each of said outer coils, whereby the relative spacing of each of said outer coils may be individually varied.

6. A tuning unit comprising an elongated base, a plurality of coils having central apertures mounted on said base so that said apertures are coaxial and said coils are axially spaced from one another, said base having spaced slots at the positions where said coils are to be mounted, said coils having mounting elements operatively connected thereto, passing through said slots from the top to beyond the bottom thereof; and holding said coils in position on the top side of said base, one of said slots being elongated in the direction of the axis of the coil mounted thereat, and a mounting connection on the underside of said base between said base and the mounting element passing through said elongated slot, said connection being adjustable in the direction of the axis of said coil, whereby the spacing of said coil relative to the other coils is independently variable.

7. A tuning unit comprising an elongated base, a plurality of coils having central apertures mounted on said base so that said apertures are coaxial and said coils are axially spaced from one another, said base having spaced slots at the positions where said coils are to be mounted, said coils having mounting elements operatively connected thereto and passing through said slots so as to hold said coils in position on the top side of said base, one of said slots being elongated in the direction of the axis of the coil mounted thereat, resilient means on the underside of said base operatively connected to the mounting element passing through said elongated slot so as to urge said element and its associated coil in one axial direction, and rigid means of adjustable effective length on the underside of said base operatively connected between said base and said mounting element, said connection being adjustable in the direction of the axis of the coil associated with said mounting element, whereby the spacing of said coil relative to the other coils is independently variable.

8. A tuning unit comprising an elongated base, more than two coils having central tuning apertures mounted on said base so that said apertures are coaxial and said coils are axially spaced from one another, said base having spaced slots at the positions where said coils are to be mounted, said coils having mounting elements operatively connected thereto and passing through said slots so as to hold said coils in position on the top side of said base, an inner one of said coils being mounted on said base so as to be axially immovable, a pair of coils outwardly axially disposed to either end of said inner coil being mounted on said base so as to be axially movable, the slots through said base where said outer coils are mounted being elongated in the direction of the axis of the coils mounted thereat, resilient means on the underside of said base operatively connected to the mounting elements passing through said elongated slots so as to urge said elements and their associated coils in one axial direction, and rigid means of adjustable effective length on the underside of said base and operatively connected between said base and said mounting elements for retaining said elements and their associated coils in a predetermined but variable position against the action of said resilient means, whereby the relative spacing of said coils is independently variable.

9. The tuning unit of claim 8, in which individual rigid means of adjustable effective length are provided for each of said outer coils, whereby the relative spacing of each of said outer coils may be individually varied.

10. A tuning unit comprising an elongated base, more than two coils having central tuning apertures mounted on said base so that said apertures are coaxial and said coils are axially spaced from one another, said base having spaced slots at the positions where said coils are to be mounted, said coils having mounting elements operatively connected thereto and passing through said slots so as to hold said coils in position on the top side of said base, an inner one of said coils being mounted on said base so as to be axially immovable, a pair of coils outwardly axially disposed to either end of said inner coil being mounted on said base so as to be axially movable, the slots through said base where said outer coils are to be mounted being elongated in the direction of the axis of the coils mounted thereat, resilient means on the underside of said base operatively connected between the mounting elements passing through said elongated slots so as to urge said elements and their associated coils toward one another and hence toward said inner coil, and rigid means of adjustable effective length on the underside of said base and operatively connected between said base and said mounting element for retaining said elements and their associated coils in a predetermined but variable position against the action of said resilient means, whereby the relative spacing of said coils is independently variable.

11. The tuning unit of claim 10, in which individual rigid means of adjustable effective length are provided for each of said outer coils, whereby the relative spacing of each of said outer coils may be individually varied.

12. A tuning unit comprising an elongated base having a channel-like cross section, a plurality of coils having central apertures mounted on said base within the channel thereof so that said apertures are coaxial and parallel to the length of said channel and said coils are axially spaced from one another, said base having spaced slots at the positions where said coils are to be mounted, said coils having mounting elements operatively connected thereto, passing through said slots from the top to beyond the bottom thereof and holding said coils in position on the top side of said base within the channel portion thereof, one of said slots being elongated in the direction of the axis of the coil mounted thereat, and a mounting connection on the underside of said base between said base and the mounting element passing through said elongated slot, said connection being adjustable in the direction of the axis of said coil, whereby the spacing of said coil relative to the other coils is variable independently of the positioning of said tuning elements.

13. A tuning unit comprising an elongated base having a channel-like cross section, a plurality of coils having central apertures mounted on said base within the channel thereof so that said apertures are coaxial and said coils are axially spaced from one another, said base having spaced slots at the positions where said coils are to be mounted, said coils having mounting elements operatively connected thereto and passing through said slots so as to hold said coils in position on the top side of said base within the channel portion thereof, one of said slots being elongated in the direction of the axis of the coil mounted thereat, resilient means on the underside of said base operatively connected to the mounting element passing through said elongated slot so as to urge said element and its associated coil in one axial direction, and rigid means of adjustable effective length on the underside of said base operatively connected between said base and said mounting element, said connection being adjustable in the direction of the axis of the coil associated with said mounting element, whereby the spacing of said coil relative to the other coils is independently variable.

14. A tuning unit comprising a base having a channel-like cross section and a slot therethrough at a point where a coil is to be mounted, a coil receivable in said channel, and a coil mounting element operatively connected to said coil and having a part passing through said slot from the top to beyond the bottom thereof, said mounting element cooperating with said slot and engaging the underside of said base to hold said coil in position, said slot being longer in the direction of the length of said channel than the part of said mounting element passing therethrough, and an adjustable connection between said base and said mounting element part, by means of which said mounting element and its associated coil may be adjustably positioned along said base.

15. The tuning unit of claim 14, in which said adjustable connection comprises a first stop member depending from said base and a second stop member depending from said mounting element and engageable with said first stop member, the relative positions of said members being adjustable so as to vary the position of said coil on said base.

16. The tuning unit of claim 14, in which said adjustable connection comprises a first stop member depending from said base and a second stop member depending from said mounting element and engageable with said first stop member, the relative positions of said members being adjustable so as to vary the position of said coil on said base, and in which a spring is active on said mounting element to urge it in a direction to bring said second stop member into engagement with said first stop member.

17. The tuning unit of claim 14, in which said mounting element comprises a U-shaped clip including a resilient body portion which resiliently engages said coil and presses it against said base and feet which pass through said slot and resiliently engage the sides thereof.

18. The tuning unit of claim 17, in which said slot is longer in the direction in the plane of said base than the part of said clip passing therethrough, and in which said mounting element additionally comprises a holder operatively connected to said coil and having a part passing through said slot and depending beneath said base, said base having a first stop member depending therefrom, and a second stop member of adjustable effective length secured to said holder part and engageable with said stop member, said holder and its associated coil thus being adjustably positionable along said base in accordance with the effective length of said second stop member.

19. A tuning unit comprising a base having a slot therethrough at a point where a coil is to be mounted, a coil on said base, and a mounting element for and operatively connected to said coil and comprising a first part which passes through said slot and is retained therein, a second part which at least partially encompasses said coil, and a third part which is resilient and which engages said coil and urges it down toward said base.

20. The tuning unit of claim 19, in which said coil is received in a holder, said holder having a portion which at least partially encompasses said coil and projects radially out therefrom and into engagement with said base, said coil thus being spaced from said base by said portion.

21. The tuning unit of claim 20, in which said holder has a part which also passes through said slot and depends therebelow.

22. A tuning unit comprising a base having a channel-like cross section and a slot therethrough at a point where a coil is to be mounted, a coil on said base and receivable in said channel, and a mounting element for and operatively connected to said coil comprising a first part which passes through said slot and is retained therein, a second part which at least partially encompasses said coil, and a third part which is resilient and which engages said coil and urges it down toward said base and into said channel.

23. The tuning unit of claim 22, in which said coil is received in a holder, said holder having a portion which at least partially encompasses said coil and projects radially out therefrom and into engagement with said base, said coil thus being spaced from said base by said portion.

24. The tuning unit of claim 23, in which said holder has a part which also passes through said slot and depends therebelow.

25. A tuning unit comprising a base having a channel-like cross section and a slot therethrough at a point where a coil is to be mounted, a coil receivable in said channel, a coil mounting element operatively connected to said coil and having a part passing through said slot from the top to beyond the bottom thereof, said mounting element engaging with the underside of said base to hold said coil in position, said slot being longer in the direction of the length of said channel than the part of said mounting element passing therethrough, and an adjustable connection between said base and said mounting element part, by means of which said mounting element and its associated coil may be adjustably positioned along said base, said adjustable connection comprising a first stop member depending from said base and a second stop member depending from said mounting element and engageable with said first stop member, the relative positions of said members being adjustable, and a spring active on said mounting element to urge it in a direction to bring said second stop member into engagement with said first stop member.

26. A tuning unit comprising a base having a channel-like cross section and a slot therethrough at a point where a coil is to be mounted, a coil receivable in said channel, and a coil mounting element operatively connected to said coil and comprising a U-shaped clip including a resilient body portion which resiliently engages said coil and presses it against said base and feet which pass through said slot from the top to beyond the bottom thereof, said feet resiliently engaging the sides of said slot and engaging the underside of said base to hold said coil in position.

27. The tuning unit of claim 26, in which said slot is longer in the direction in the plane of said base than the part of said clip passing therethrough, and in which said mounting element additionally comprises a holder operatively connected to said coil and having a part passing through said slot and depending beneath said base, said base having a first stop member depending therefrom, and a second stop member of adjustable effective length secured to said holder part and engageable with said stop member, said holder and its associated coil thus being adjustably positionable along said base in accordance with the effective length of said second stop member.

References Cited in the file of this patent

UNITED STATES PATENTS

| | | |
|---|---|---|
| 2,229,404 | Canon et al. | Jan. 21, 1941 |
| 2,269,784 | Polydoroff | Jan. 13, 1942 |
| 2,563,240 | Heath | Aug. 7, 1951 |

FOREIGN PATENTS

| | | |
|---|---|---|
| 865,808 | France | Mar. 10, 1941 |